(12) United States Patent
Estacio

(10) Patent No.: US 6,830,959 B2
(45) Date of Patent: Dec. 14, 2004

(54) SEMICONDUCTOR DIE PACKAGE WITH SEMICONDUCTOR DIE HAVING SIDE ELECTRICAL CONNECTION

(75) Inventor: Maria Cristina B. Estacio, Cebu City (PH)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/346,682

(22) Filed: Jan. 17, 2003

(65) Prior Publication Data

US 2003/0139020 A1 Jul. 24, 2003

Related U.S. Application Data

(60) Provisional application No. 60/351,587, filed on Jan. 22, 2002.

(51) Int. Cl.[7] .................................................. H01L 21/44
(52) U.S. Cl. ........................ 438/113; 257/620; 257/621; 257/730
(58) Field of Search ................................. 438/113, 458, 438/462; 257/620, 622

(56) References Cited

U.S. PATENT DOCUMENTS

| | | | |
|---|---|---|---|
| 4,110,782 A | * | 8/1978 | Nelson et al. ............... 257/502 |
| 4,717,641 A | * | 1/1988 | Belmont et al. ............. 430/198 |
| 5,016,080 A | * | 5/1991 | Giannella .................... 257/620 |
| 5,314,844 A | | 5/1994 | Imamura |
| 5,559,362 A | | 9/1996 | Narita |
| 5,611,876 A | * | 3/1997 | Newton et al. ........... 156/89.12 |
| 5,710,068 A | * | 1/1998 | Hill ............................. 438/171 |
| 5,765,280 A | | 6/1998 | Joshi |
| 5,767,578 A | * | 6/1998 | Chang et al. ................ 257/717 |
| 5,824,177 A | * | 10/1998 | Yoshihara et al. ........... 156/250 |
| 5,861,667 A | * | 1/1999 | Kuwano ...................... 257/691 |
| 6,121,118 A | | 9/2000 | Jin et al. |
| 6,121,119 A | | 9/2000 | Richards et al. |
| 6,309,943 B1 | | 10/2001 | Glenn et al. |
| 6,423,623 B1 | | 7/2002 | Bencuya et al. |
| 2002/0066939 A1 | * | 6/2002 | Metzler ....................... 257/594 |
| 2002/0109133 A1 | * | 8/2002 | Hikita et al. .................. 257/10 |
| 2002/0190397 A1 | * | 12/2002 | Kim ............................ 257/796 |

OTHER PUBLICATIONS

Logan, et al., "Advanced Packaging of Integrated Passive Devices for RF Applications," Intarsia Corporation, 4 pages, (Jan. 30, 2001).

* cited by examiner

*Primary Examiner*—Long Pham
*Assistant Examiner*—Nathan W. Ha
(74) *Attorney, Agent, or Firm*—Townsend and Townsend and Crew LLP

(57) ABSTRACT

A semiconductor die package is disclosed. In one embodiment, the semiconductor die package includes a circuit substrate including a conductive region. A semiconductor die is on the circuit substrate. The semiconductor die includes an edge and a recess at the edge. A solder joint couples the semiconductor die and the conductive region through the recess.

18 Claims, 10 Drawing Sheets

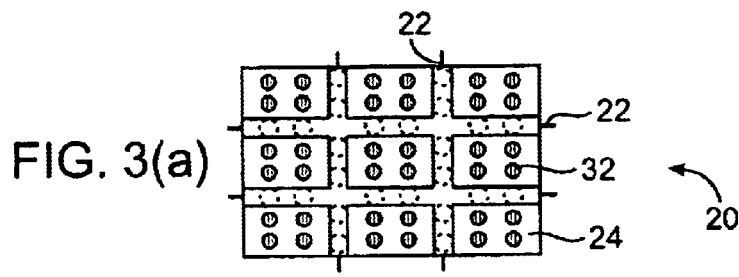
FIG. 3(a)
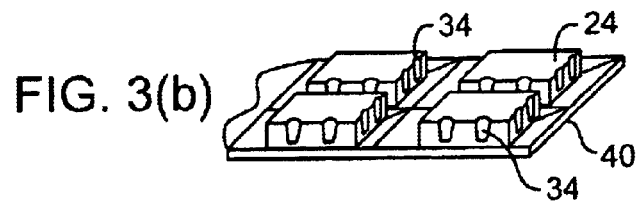
FIG. 3(b)
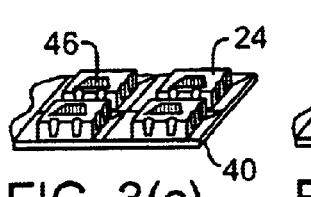
FIG. 3(c)
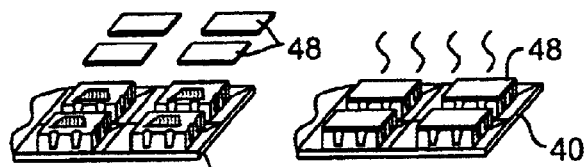
FIG. 3(d)    FIG. 3(e)
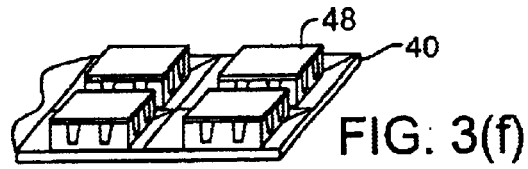
FIG. 3(f)
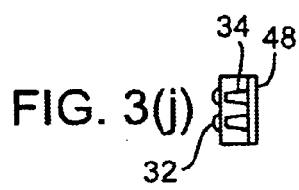
FIG. 3(j)
FIG. 3(i)
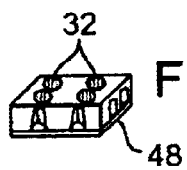
FIG. 3(g)
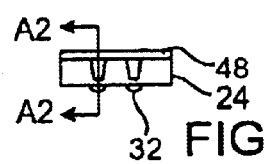
FIG. 3(h)
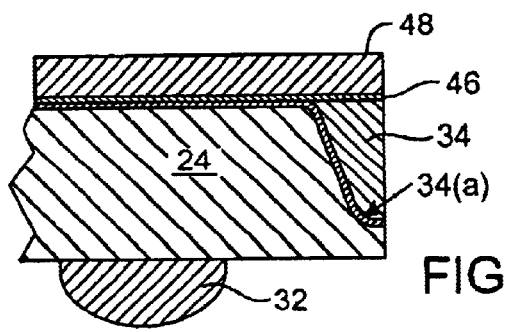
FIG. 3(k)

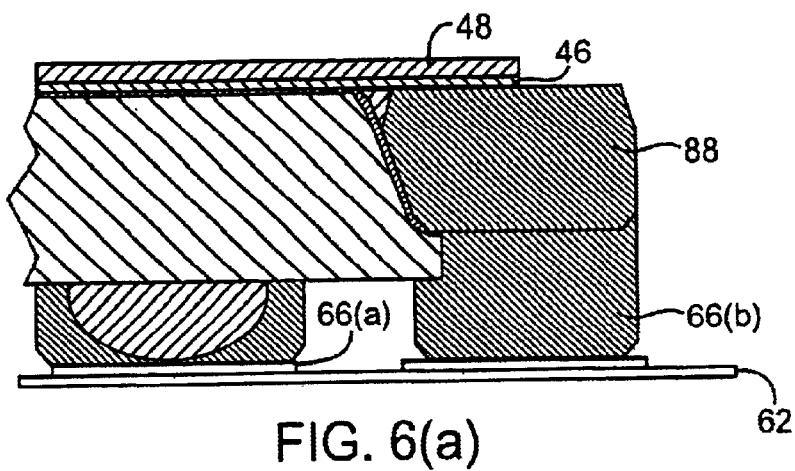
FIG. 6(a)
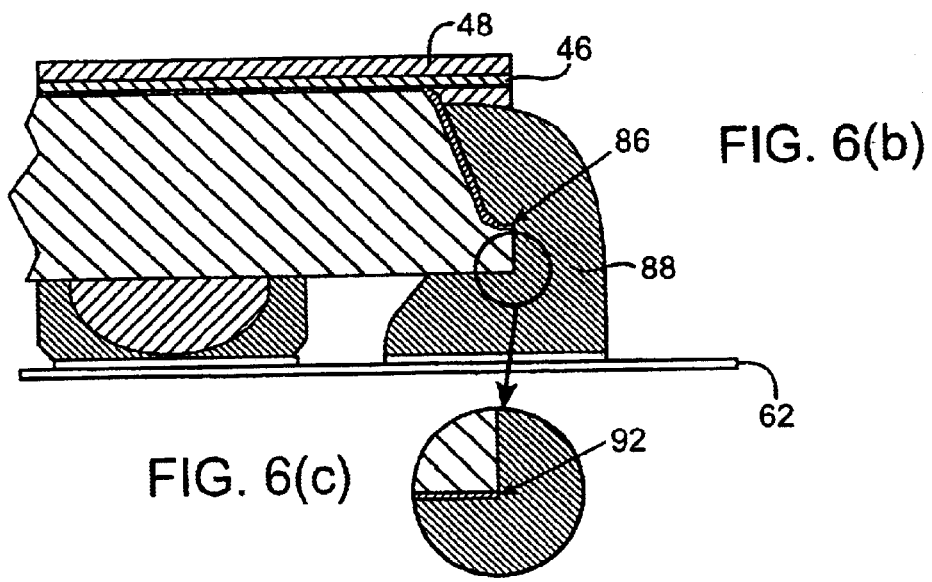
FIG. 6(b)
FIG. 6(c)
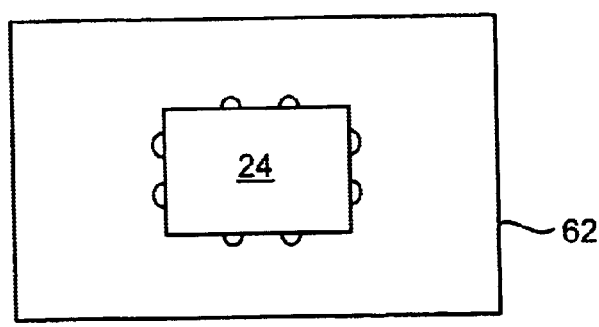
FIG. 6(d)

SEMICONDUCTOR DIE PACKAGE WITH SEMICONDUCTOR DIE HAVING SIDE ELECTRICAL CONNECTION

CROSS REFERENCE TO RELATED APPLICATIONS

This application claims the benefit of the filing date of U.S. Provisional Patent Application No. 60/351,587, filed on Jan. 22, 2002. This U.S. Provisional Patent Application is herein incorporated by reference in its entirety.

BACKGROUND OF THE INVENTION

There are a number of semiconductor die packages. In one example of a semiconductor die package, a semiconductor die is mounted to a lead frame with leads. Wires couple the semiconductor die to the leads. The wires, the semiconductor die and then the most of the lead frame (except for the leads that extend outward) are then encapsulated in a molding material. The molding material is then shaped. The formed semiconductor die package includes a molded body that has leads extending laterally away from the molded body. The semiconductor die package is then mounted onto a circuit board.

While such semiconductor die packages are useful, improvements could be made. For example, as consumer electronics (e.g., cell phones, laptop computers, etc.) continue to decrease in size, there is an increasing demand to decrease the thickness of electronic devices while increasing the density of devices. In addition, there is a need to improve the heat dissipation properties of a conventional semiconductor die package. Dissipating heat from chips is a continuing problem in the field of semiconductor packaging. Other problems that need to be addressed include reducing the "on resistance" (RDSon) of components on a circuit board and reducing the footprint of components on a circuit board. With respect to the footprint of such components, in the above molded package example, the leads that extend laterally away from the molded body increase the footprint of the package. It would be desirable if the footprint of such components could be reduced so that more components could be placed on a circuit board. For example, for a semiconductor die including a power MOSFET including a source region, a gate region, and a drain region, it would be desirable to ultimately achieve about a 1:1 chip to package size ratio without reducing the effective source area in the semiconductor die.

Embodiments of the invention address these and other problems individually and collectively.

SUMMARY OF THE INVENTION

Embodiments of the invention relate to semiconductor die packages.

One embodiment of the invention is directed to a method comprising: (a) forming a semiconductor wafer comprising a plurality of semiconductor dies defined by scribe lines; (b) forming a plurality of cavities in the semiconductor wafer in the vicinity of the scribe lines; and (c) dicing the wafer along the scribe lines to separate the semiconductor dies, wherein each separated semiconductor die comprises a vertical transistor and includes at least one recess at an edge of the semiconductor die.

Another embodiment of the invention is directed to a semiconductor die package comprising: (a) a circuit substrate including a conductive region; (b) a semiconductor die on the circuit substrate, wherein the semiconductor die comprises a vertical transistor and includes an edge and a recess at the edge; and (c) a solder joint coupling the semiconductor die and the conductive region through the recess.

These and other embodiments of the invention are described in further detail below.

BRIEF DESCRIPTION OF THE DRAWINGS

FIG. 3(a) shows a plan view of an array of bumped semiconductor dies.

FIG. 3(b) shows a plan view of an array of bumped semiconductor dies on chiptrays after dicing.

FIGS. 3(c)–3(f) show an array of semiconductor dies as heat sinks are attached.

FIGS. 3(g)–3(j) show various views of a semiconductor die with a heat sink.

FIG. 3(k) shows a cross-section view of a portion of the semiconductor die shown in FIG. 3(h) along the line A2—A2.

FIGS. 6(a)–6(b) show side cross-sectional views of a portion of a semiconductor die as it is being mounted on a circuit substrate.

FIG. 6(c) shows an enlarged portion of a corner region of a semiconductor die.

FIG. 6(d) shows a plan view of a semiconductor die on a circuit substrate.

In FIGS. 1(a)–6(d), like numerals designate like elements.

DETAILED DESCRIPTION

Figure 1A:
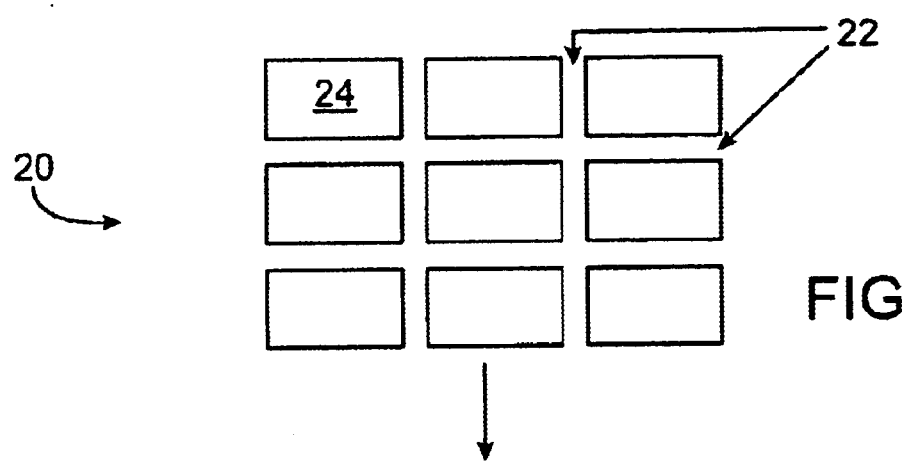
FIG. 1(a) shows a schematic plan view of the back side of a semiconductor wafer.

In embodiments of the invention, a number of drain site connections are formed in the back side of a semiconductor wafer in the vicinity of the scribe lines. The scribe lines define the borders of the semiconductor dies in the semiconductor wafer. In preferred embodiments, the drain site connections are conically-shaped cavities (e.g., castellations) formed in the back side of the semiconductor wafer. The cavities may extend partially or entirely through the semiconductor wafer. The profile of each of the conically-shaped cavities can be selected to maximize the formation of a solder joint through capillary action. There are many different packaging configurations, but the final drain connection for each of these configurations can happen during the mounting of the semiconductor die to a circuit substrate. It is also during the board mounting process where the source and gate bumps are soldered on their respective lands on the circuit substrate.

As used herein, the semiconductor die packages can include any suitable number of semiconductor dies mounted to any suitable circuit substrate of any suitable size. Embodiments of the invention are preferably "chip scale packages", where the size of the semiconductor die package is close to the size of the semiconductor die itself.

Embodiments of the invention have a number of advantages. First, embodiments of the invention have a high RDS on per footprint area. Second, in embodiments of the invention, the drain contacts are maximized on the die perimeter through conically-shaped drain connections thus enhancing the thermal performance of the semiconductor die packages. Third, the semiconductor dies may have heat sinks attached to their backs. The heat sinks may take the form of copper slugs. The presence of a copper slug on the back of a semiconductor die is a practical approach when using a semiconductor die that is about 4-mil thick (with back side grooves). Fourth, in embodiments of the invention, the source region of a MOSFET in a semiconductor die is directly connected to a source contact on a circuit board. This maximizes the source current to the MOSFET and reduces the on resistance (RDSon) of the MOSFET. Fifth, the total cross-sectional area for the solder contacts in the semiconductor die packages is high across the gate, source, and drain so that embodiments of the invention can be used in high current applications. Sixth, in embodiments of the invention, recesses at the edges of the semiconductor dies promote the capillary flow of solder during reflow to form solder joints substantially automatically. The solder joints can be formed with repeatability and accuracy.

In embodiments of the invention, a semiconductor wafer comprising a plurality of semiconductor dies defined by scribe lines is formed. Then, a plurality of cavities is formed in the semiconductor wafer in the vicinity of the scribe lines. The wafer is then diced along the scribe lines to separate the semiconductor dies. Each diced and separated semiconductor die includes at least one recess at an edge of the semiconductor die. In some embodiments, each edge can include one or more recesses. For example, all four edges of a semiconductor die may include at least one recess in some embodiments.

The semiconductor dies can include vertical power transistors. Vertical power transistors include VDMOS transistors and vertical bipolar power transistors. A VDMOS transistor is a MOSFET (metal oxide semiconductor field effect transistor) that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. During operation, the current flow from the source region to the drain region in a VDMOS device is substantially perpendicular to the die surfaces. In other embodiments, the transistors in the semiconductor dies can be bipolar transistors. In such embodiments, one side of the semiconductor die can have an emitter region and a base region. The other side of the die can have a collector region.

FIG. 1(a) shows the back side of a semiconductor wafer 20 having a plurality of semiconductor dies 24 formed therein. The semiconductor dies 24 are defined by scribe lines 22. The semiconductor wafer 20 may include any suitable semiconductor material including silicon and gallium arsenide. The back side of the semiconductor wafer 20 can correspond to the drain regions of the MOSFETs in the semiconductor dies 24.

Figure 1B:
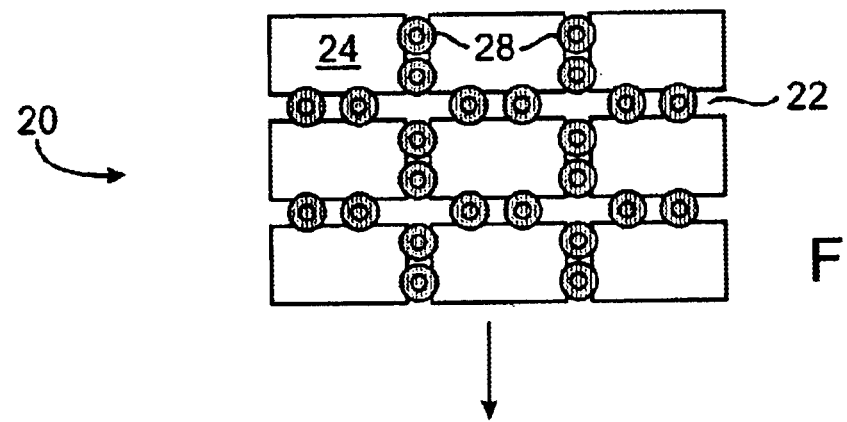
FIG. 1(b) shows drain connection sites that are defined in the back side of the semiconductor wafer shown in FIG. 1(a).

As shown in FIG. 1(b), a plurality of cavities 28 is formed in the semiconductor wafer 20 in the vicinity of the scribe lines 22. Each cavity 28 can extend partially through the semiconductor wafer 20 or entirely through the semiconductor wafer 20. Each cavity 28 may also be conically-shaped, with the larger portion of the conically-shaped cavity being proximate the back side of the wafer 20 and the narrower part of the conically-shaped cavity being proximate the front side of the wafer 20.

Any number of cavities 28 can be formed in any suitable manner. For example, the plurality of cavities 28 can be formed by a photolithography and etching process. Photolithography and etching processes are well known in the art. Wet etching or dry etching could be used to form the cavities 28. In another example, the plurality of cavities 28 can be formed using a laser etching or water-jet etching process.

Figure 1C:
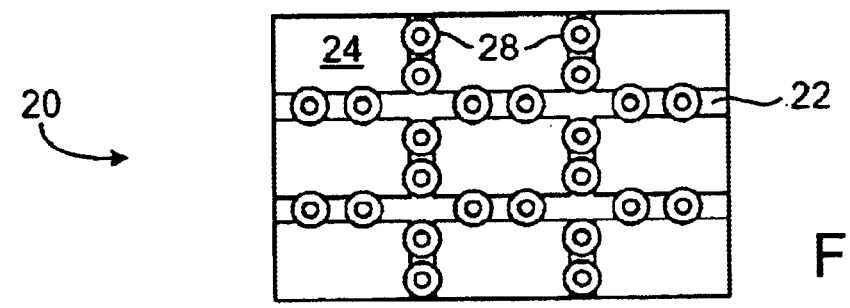
FIG. 1(c) shows the drain connection sites at the back side of the semiconductor wafer shown in FIG. 1(b) after further processing.

FIG. 1(c) shows a schematic view of the back side of the semiconductor wafer 20 after additional processing. Additional processing steps that can be performed include back-grinding the semiconductor wafer, and performing a stress relief etch process. A back metallization process could also be performed.

In a back metallization process, metal is deposited on the back side of the semiconductor wafer. During this process, metal can also coat the inner walls and the bottoms of the cavities in the plurality of cavities 28. Various processes can be used to deposit metal on the back side of the semiconductor wafer 20. Exemplary processes include sputtering, ion assisted deposition, and vapor deposition. The metal that is deposited during the back metallization process is preferably wettable with solder. Exemplary back metallization metals include aluminum, copper, nickel, tungsten, etc.

After back metallizing the semiconductor wafer 20, the semiconductor wafer can be diced to separate the individual semiconductor dies 24 from each other. Dicing can occur in any suitable manner. For example, a dicing saw or a laser could be used to dice the semiconductor wafer 20.

Figure 1E:
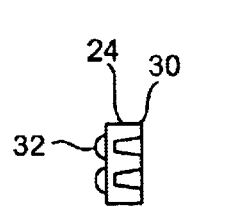
FIGS. 1(e) and 1(f) show side views of semiconductor dies.
Figure 1D:
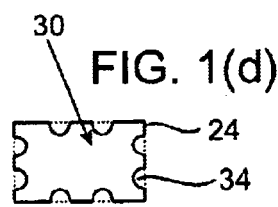
FIG. 1(d) shows the sputtered solderable backmetal on the back side of a semiconductor die.
Figure 1F:
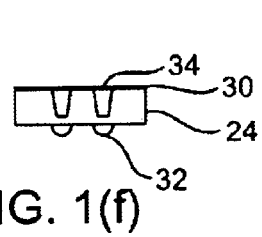

FIGS. 1(d)–1(f) show a semiconductor die 24 after it has been diced and bumped. FIGS. 1(d)–1(f) show a back side view of the semiconductor die 24 with a sputtered, solderable backmetal 30 on it. The edges of the semiconductor die 24 have a number of recesses 34 where the previously formed cavities were present. In this example, there are two recesses 34 per edge, and the semiconductor die 24 has four edges. In other embodiments, however, there could be more or less recesses per edge.

FIGS. 1(e)–1(f) show a plurality of solder bumps 32 on the front side of the semiconductor die 24. The solder bumps 32 can serve as source and gate connections for a MOSFET in the semiconductor die 24. The solder bumps 32 can be deposited on the semiconductor die 24 before or after it is separated from the other semiconductor dies 24 in the dicing process. They can be deposited using any suitable solder deposition process including pick and place, stencil printing, and electroplating.

Figure 1G:
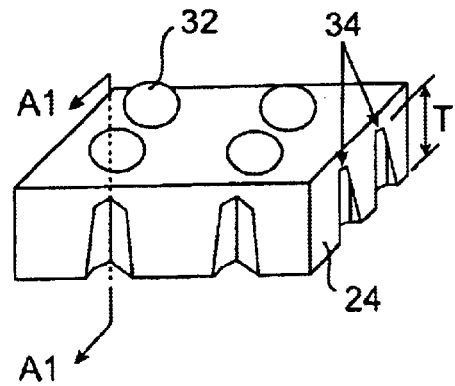
FIG. 1(g) shows a perspective view of the front side of a bumped semiconductor die.
Figure 1H:
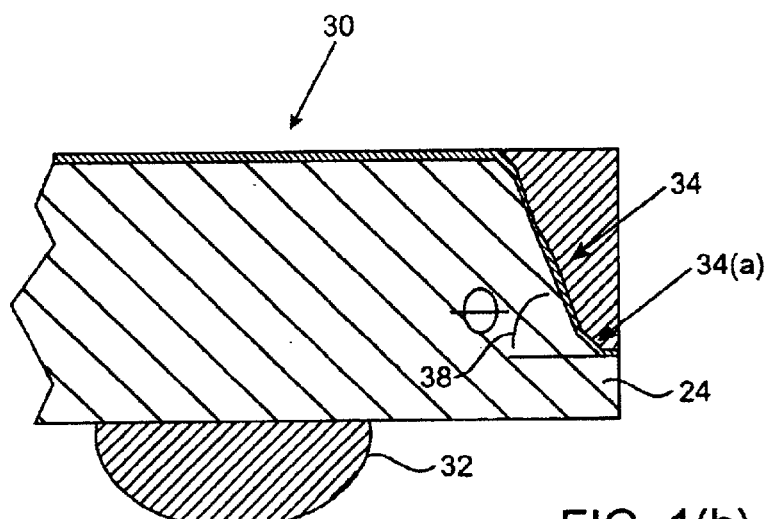
FIG. 1(h) shows a portion of the bumped die shown in FIG. 1(g) along the line A1—A1.

FIG. 1(g) shows an enlarged, bumped semiconductor die 24. As shown in FIG. 1(g), the sides of the semiconductor die 24 have a number of recesses 34. Each recess 34 has a larger portion that is proximate the back side of the semiconductor die 24 and a smaller portion that is proximate the front side of the semiconductor die 24. As shown in FIGS. 1(g) and 1(h), the recesses 34 start at the back side of the semiconductor die 24, and extend partially through the semiconductor die 24. In other embodiments, the recesses 34 could extend entirely through the semiconductor die 24. The depth of each recess 34 can be greater than half the thickness of the semiconductor die.

Each recess 34 can be a castellation-like site for a drain contact, and can resemble a half-cone shape. Each recess 34 can be deep enough so that solder that is present at the bottom of the recess 34 can contact solder on a conductive land on a circuit substrate before solder reflow, thus forming a side electrical connection through the recess 34. Typically, solder (not shown) that is present on the base 34(a) of the recess 34 will form an electrical connection with solder that is present on a conductive land of a circuit substrate. The electrical connection can be the drain connection to the back side of the semiconductor die 24.

Referring to FIG. 1(h), the recess 34 provides a site for solder flow and contact when the semiconductor die 24 is mounted to a circuit substrate such as a circuit board. The angle of inclination (theta) ensures full and uniform coverage of the back metal up to the base of the cone-like recess during the formation of the back metal layer 30. Suitable angles for the angle of inclination may be about 60 degrees to about 45 degrees. Low angles of inclination (e.g., less than about 60 degrees) can increase the likelihood that the solder joint that is eventually and partially formed inside of the recess 34 will be spaced from the edge of the die. For example, as shown in FIG. 4(h) (described below), at least a majority of the conductive region 64(b) under a solder joint 68 can be outside of the perimeter of the semiconductor die 24 to ensure that the formed solder joint 68 extends away from the die 24. Specific angles of inclination can be formed using techniques known in the art including laser etching, or chemical etching (dry or wet).

The interface at the edge of the die and the solder joint can be a point of stress. The conductive land pattern on a circuit substrate (e.g., a circuit board) coinciding with the drain contacts is preferably laid out to ensure spacing between the solder joint and the edge of the die. Recesses that are partially formed in the die, rather than all the way through the semiconductor die, can also help space the formed solder joint from the edge of the semiconductor die.

Figure 2A:
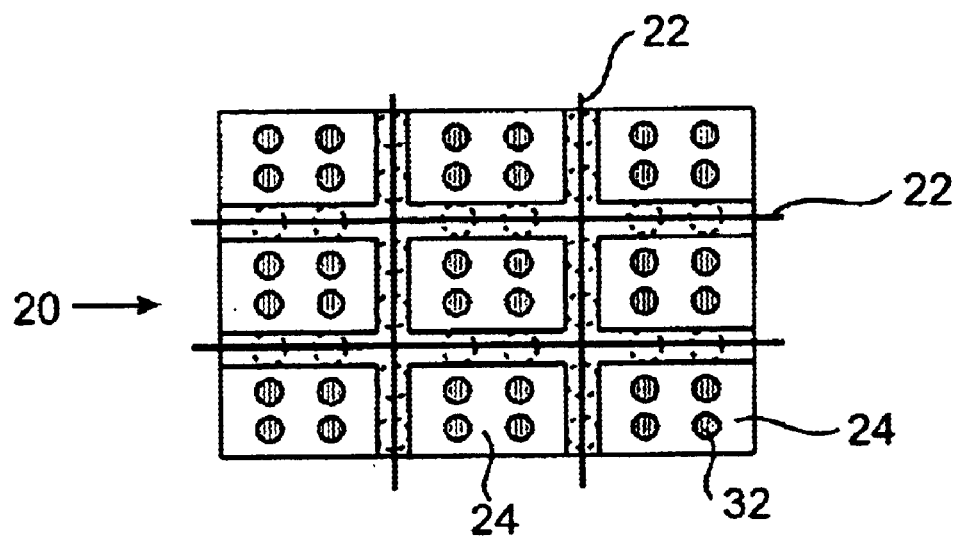
FIG. 2(a) shows a plan view of an array of bumped semiconductor dies in a semiconductor wafer.
Figure 2B:
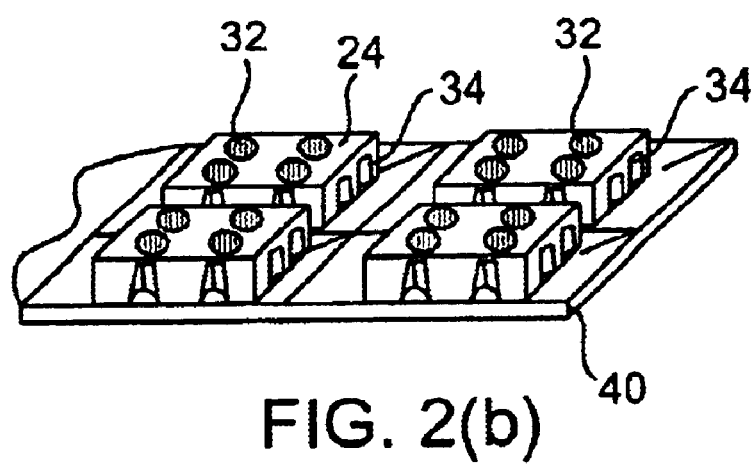
FIG. 2(b) shows a perspective view of a plurality of bumped semiconductor dies on chiptrays after dicing.

FIGS. 2(a)–2(b) illustrate the process of forming semiconductor dies without heat sinks on the individual dies. FIG. 2(a) shows an undiced semiconductor wafer 20 including a plurality of semiconductor dies 24 and a plurality of solder bumps 32 on the semiconductor dies 24. In this example, the semiconductor dies 24 are bumped with solder before dicing. In other embodiments, the semiconductor dies 24 can be bumped after dicing. After the semiconductor wafer 20 is diced to separate the semiconductor dies 24 from each other, they are placed on chiptrays 40 as shown in FIG. 2(b). Then, the semiconductor dies 24 can be electrically tested. After testing, the semiconductor dies 24 can be placed on a tape, and then wound on a reel.

A process of forming semiconductor dies with heat sinks on the backs of the semiconductor dies can be described with reference to FIGS. 3(a)–3(k). The die packages will exhibit improved thermal performance. In the foregoing examples, the heat sinks are in the form of planar, copper slugs. However, in other embodiments, heat sinks with vertically oriented heat dissipating fins could be used.

FIG. 3(a) shows a semiconductor wafer 20 with bumped semiconductor dies 24 before dicing. After dicing, as shown in FIG. 3(b), the semiconductor dies 24 are placed in chiptrays 40. Unlike FIG. 2(b), however, the semiconductor dies 24 are placed in the chiptrays 40 (e.g., ceramic chiptrays) so that the solder bumps on them face downward into the chiptrays 40. As shown in FIG. 3(c), solder paste 46 can be deposited on the back sides of the semiconductor dies 24. The solder paste 46 may comprise Pb—Sn solder or another suitable solder material. Then, as shown in FIGS. 3(d) and 3(e), heat sinks 48 are attached to the backsides of the semiconductor dies 24 and then the semiconductor dies 24 are heated to reflow the solder paste. A single apparatus can be used to perform the process steps illustrated in FIGS. 3(c)–3(e).

In some embodiments, the heat sinks 48 can be marked to identify the semiconductor dies. After attaching the heat sinks 48 to the semiconductor dies 24, the semiconductor dies can be tested. After testing, the semiconductor dies 24 can be placed on a tape and reel. FIGS. 3(i)–3(h) show a semiconductor die 24 with a heat sink 48 on it from various views.

FIG. 3(k) shows an enlarged portion of a semiconductor die in the vicinity of the recess 34. The recess 34 has a base 34(a). Solder (not shown) can be present at the base 34(a).

The mounting of the semiconductor dies can be described with reference to FIGS. 4(a)–4(h).

Figures 4A, 4B:
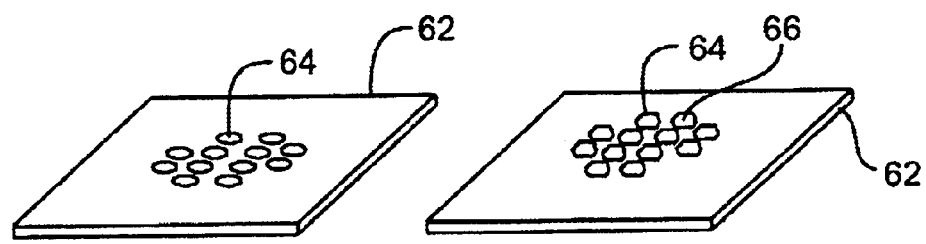
FIGS. 4(a)–4(d) show a semiconductor die as it is mounted on a circuit substrate.

FIG. 4(a) shows a circuit substrate 62 with a plurality of conductive regions 64. The circuit substrate 62 can be a circuit board or a carrier for a semiconductor die. The circuit substrate 62 can comprise one or more insulating layers comprising a polymeric or ceramic material. The conductive regions 64 can be in the form of solderable metal traces such as conductive lands, conductive lines, etc.

FIG. 4(b) shows a plurality of solder bumps 66 formed on the conductive regions 64. The plurality of solder bumps 66 can be formed by electroplating, stenciling, pick and place, screen printing, etc.

Figure 4C:
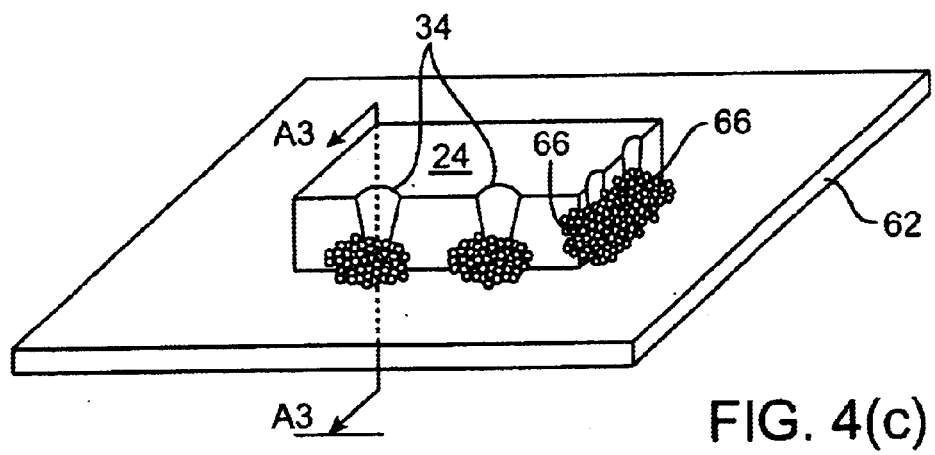
Figure 4D:
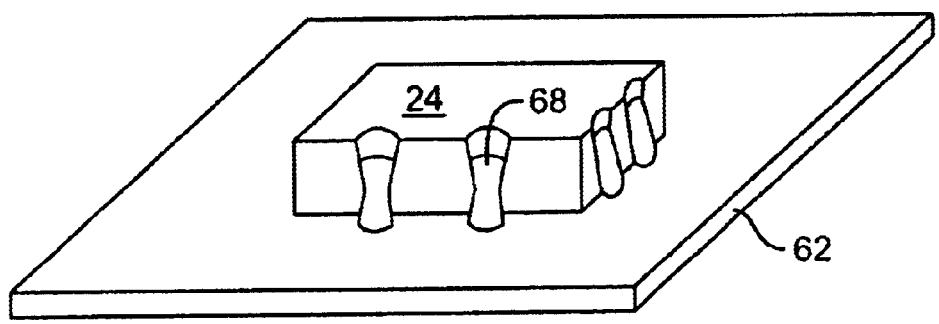
Figure 4E:
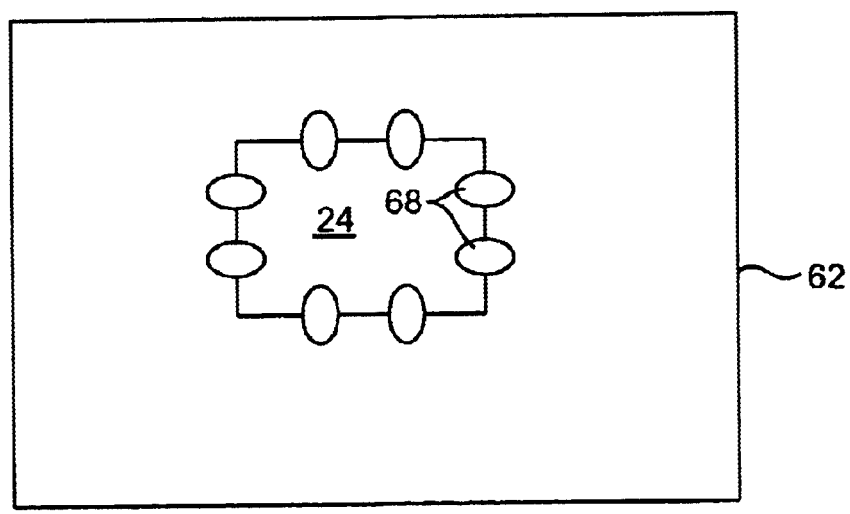
FIG. 4(e) is a plan view of a semiconductor die on a circuit substrate.

As shown in FIG. 4(c), the semiconductor die 24 with recesses 34 at its side can be mounted on the circuit substrate 62. The recesses 34 at the sides of the semiconductor die 24 contact the solder bumps 66 that are on the conductive regions 64. A pick and place process can be used to mount the semiconductor die 24 on the circuit substrate 62. After mounting, a reflow process can be performed to reflow the solder 66. As shown in FIGS. 4(d) and 4(e), the reflowed solder bumps form solder joints 68 that are at least partially present in the recesses 34. These solder joints 68 may serve as drain connections to the back side of the semiconductor die 24.

Prior to mounting, in this example, the semiconductor die 24 did not have solder bumps on the semiconductor die 24. Accordingly, in this example, prior to mounting, the semiconductor die 24 could be considered a "bumpless" die that is mounted on the circuit substrate 62. This makes soldering easier in comparison to having a bumped die. Of course, in other embodiments, the die could be bumped with solder.

Figure 4F:
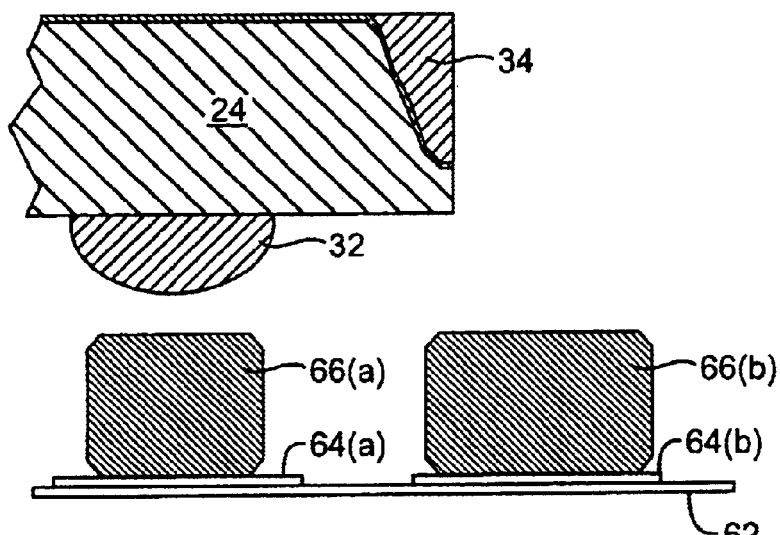
FIGS. 4(f)–4(h) show a cross-sectional view of a portion of a bumped semiconductor die as it is being mounted on a circuit substrate.
Figure 4G:
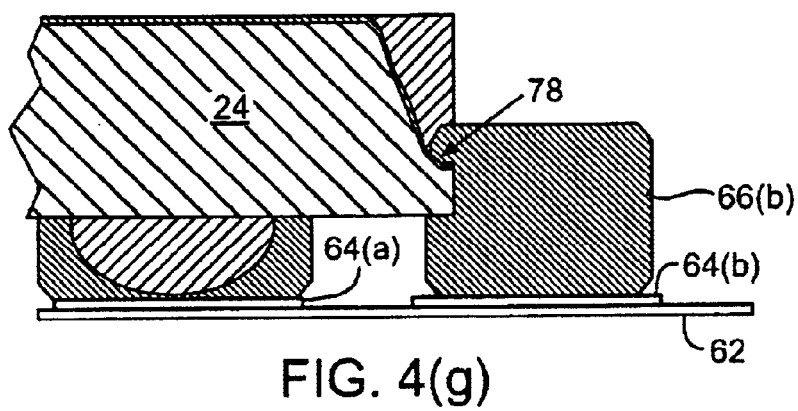
Figure 4H:
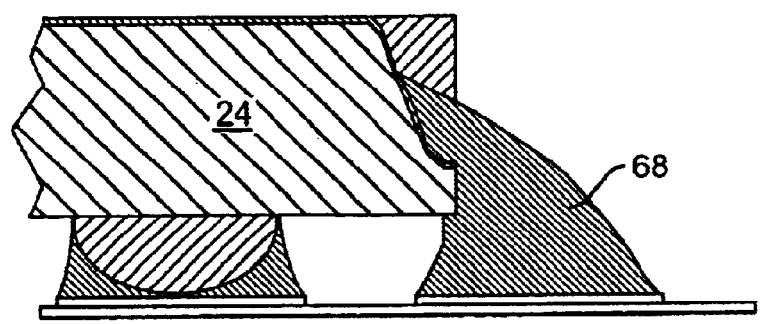

FIGS. 4(f)–4(h) show close up views of a semiconductor die 24 as it is being mounted on a circuit substrate 62. The circuit substrate 62 includes a number of conductive regions 64(a), 64(b) with solder bumps 66(a), 66(b). Solder bump 66(a) couples to solder bump 32 on the semiconductor die 24. Solder bump 66(b) couples to the recess 34 at the side of the semiconductor die 34. As shown in FIG. 4(h), after reflow, a solder joint 68 with the top portion of the solder joint 68 contacting the recess 34 walls is formed. The base of the solder joint 68 is seated on the conductive region 64(b) which may be a metal trace of a printed circuit board (PCB).

It is understood that the depiction of the semiconductor die 24 and other components are simplified for purposes of illustration in FIGS. 4(f)–4(h) and in other Figures. It is understood that those of ordinary skill in the art can provide for an appropriate edge termination structure in the semiconductor die 24 in order to electrically isolate the solder bump 32 and the solder joint 68. For example, photosensitive BCB (benzcyclobutane) or polyimide can be used to coat the edges or bottom of a die to electrically isolate the solder bump 32 and the solder joint 68.

Figure 5A:
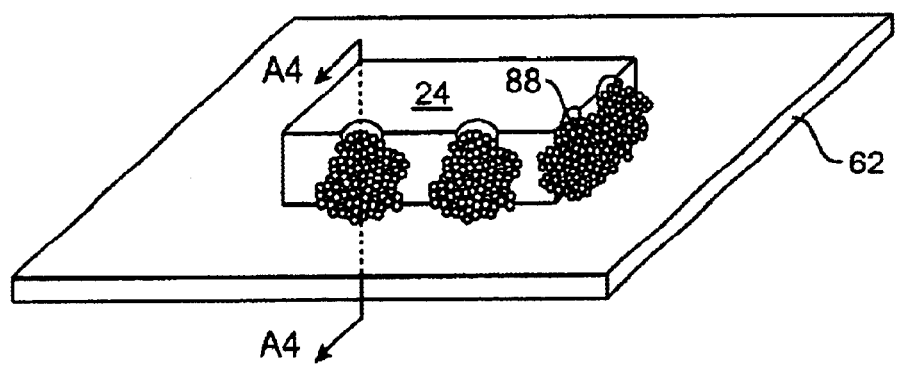
FIGS. 5(a)–5(b) show perspective views of a semiconductor die on a circuit substrate after mounting and after reflow.
Figure 5B:
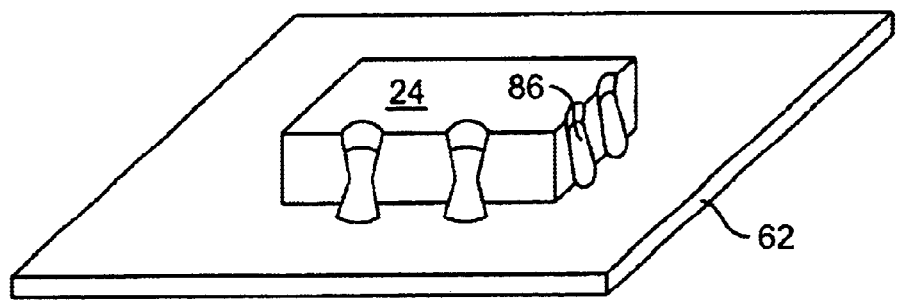

FIGS. 5(a) and 5(b) show a semiconductor die package as it is formed with larger solder joints. A die can be mounted on a circuit substrate in the manner shown in FIGS. 4(a)–4(c). Then, as shown in FIG. 5(a), additional solder 86 is deposited on the recesses 34 after the semiconductor die 24 is mounted to the circuit substrate 62. FIG. 5(b) shows the semiconductor die package after reflow. After reflow, larger solder joints 86 are formed. These solder joints 86 couple the recesses to the conductive regions of the circuit substrate 62.

Figure 5C:
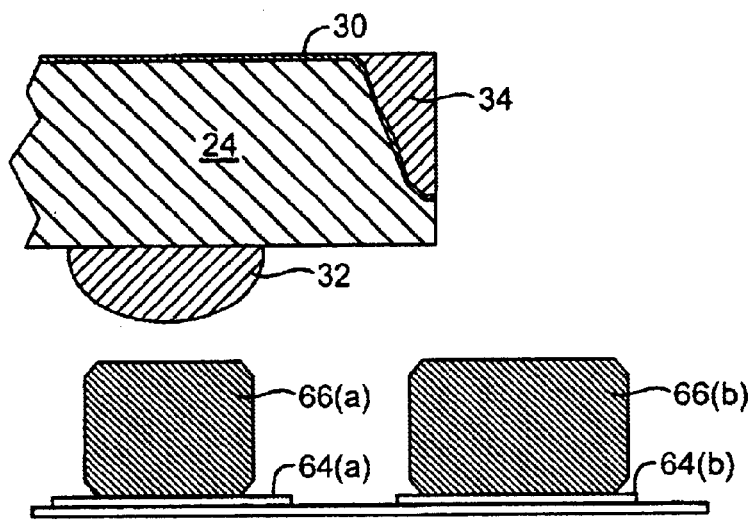
FIGS. 5(c)–5(e) show side cross-sectional views of a portion of a semiconductor die as it is being mounted on a circuit substrate.
Figure 5D:
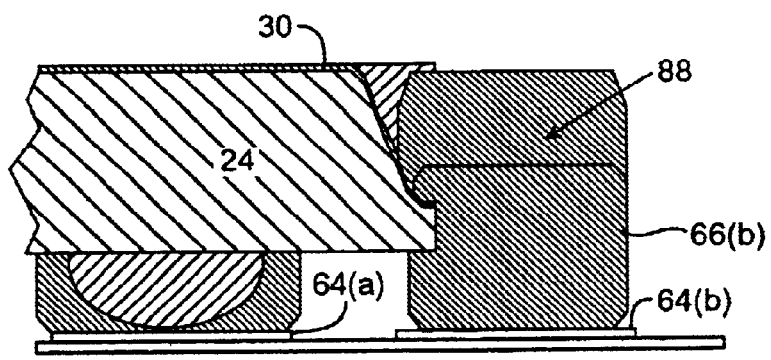
Figure 5E:
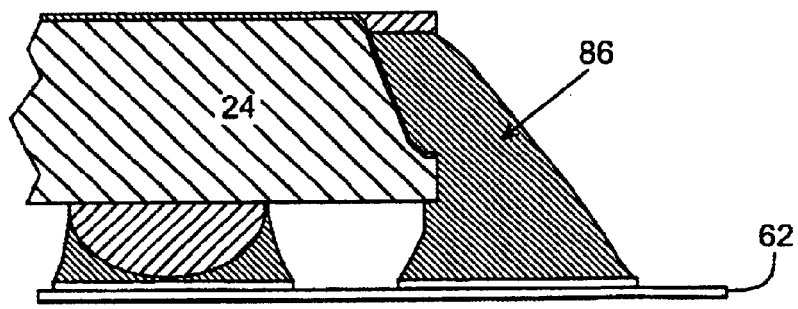

As shown in FIG. 5(c), a solder bumped semiconductor die 24 processed in the previously described manner is mounted on a circuit substrate 62 with conductive regions 64(a), 64(b). The conductive regions 64(a), 64(b) have solder bumps 66(a), 66(b) on them. As shown in FIG. 5(d), the solder bump 32 on the semiconductor die 24 contacts the solder bump 66(a) on the conductive region 64(a). The solder bump 66(b) contacts the recess 34 at the edge of the semiconductor die 24. Then, additional solder 88 is deposited on the solder bump 66(b) to provide a better electrical connection to the back side metal 30 and to the drain region in the MOSFET in the semiconductor die 24. As shown in FIG. 5(e), after reflow, the solder 66(b), 88 forms a solder joint 86.

In the embodiment shown in FIGS. 5(c)–5(e), the second solder paste printing or dispensing step will allow more drain contact to the metal in the recess 34, which is connected to the drain in the MOSFET in the semiconductor die 24. This results in a taller and wider solder joint after reflow.

The semiconductor die 24 in FIGS. 6(a) and 6(b) is mounted in a similar manner as the semiconductor die 24 in FIGS. 5(c)–5(e). However, in FIGS. 6(a) and 6(b), a heat sink 48 and a solder layer 46 are on the semiconductor die 24.

An enlarged view of a corner of the semiconductor die 24 is shown in FIG. 6(c). As shown therein, an insulating layer 92 is present at the front side of the semiconductor die 24. The insulating layer 92 may comprise a material such as benzcyclobutane (BCB). The insulating layer 92 can have a thickness between about 8 to about 10 microns. Its coverage can extend to the scribe lines in a semiconductor wafer and will come into contact with the solder joint after reflow. This isolation ensures off-contact to the silicon edge which can be a stress point that can effect solder joint reliability. A top plan view of the semiconductor die 24 is shown in FIG. 6(d).

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, one or more features of one or more embodiments of the invention may be combined with one or more features of other embodiments of the invention without departing from the scope of the invention.

What is claimed is:

1. A method comprising:

(a) forming a semiconductor wafer comprising a plurality of semiconductor dies defined by scribe lines;

(b) forming a plurality of cavities in the semiconductor wafer in the vicinity of the scribe lines; and (c) dicing the wafer along the scribe lines to separate the semiconductor dies, wherein each separated semiconductor die comprises a vertical transistor comprising a source region at a front side of the semiconductor die and a drain region at a back side of the semiconductor die, and wherein the semiconductor die includes at least one recess at an edge of the semiconductor die, and further comprising deposition solder in the at least one recess.

2. The method of claim 1 wherein each of the cavities in the plurality of cavities extends partially through the semiconductor wafer.

3. The method of claim 1 wherein the plurality of cavities is formed using an etching process.

4. The method of claim 1 wherein each of the plurality of cavities extends through the semiconductor wafer.

5. The method of claim 1 wherein the semiconductor wafer includes a front side and a back side, and wherein each of the plurality of cavities as formed at the back side of the semiconductor wafer.

6. The method of claim 1 further comprising attaching a heat sink to each separated semiconductor die.

7. The method of claim 1 further comprising:

d) attaching at least one of the separated dies to a circuit substrate, wherein the source region of the at least one semiconductor die faces the the circuit substrate and the drain region opposes the circuit substrate.

8. The method of claim 1 wherein the at least one recess extend partially through the die after dicing.

9. The method of claim 1 wherein the wafer comprises a back side, and wherein the method further comprises:

depositing metal over the entire back side of the wafer before (c).

10. A method comprising:

(a) forming a semiconductor wafer comprising a plurality of semiconductor dies defined by scribe lines;

(b) forming a plurality of cavities in the semiconductor wafer in the vicinity of the scribe lines;

(c) dicing the wafer along the scribe lines to separate the semiconductor dies, wherein each separated semiconductor die comprises a vertical transistor comprising a source region at a front side of the semiconductor die and a drain region at a back side of the semiconductor die, and wherein the semiconductor die includes at least one recess at an edge of the semiconductor die; and (d) attaching the separated dies to circuit substrates, wherein for each semiconductor die, a solder material couples the semiconductor die to one of the circuit substrates, through the at least one recess at the edge of the semiconductor die.

11. A semiconductor die package comprising:

(a) a circuit substrate including a conductive region;

(b) a semiconductor die comprising a vertical transistor on the circuit substrate, wherein the semiconductor die includes an edge and a recess at the edge, wherein the recess extends partially through the semiconductor die, and wherein the semiconductor die includes a front side, a back side, a source region at the front side, and a drain region at the back side; and (c) a solder joint coupling the drain region of the semiconductor die and the conductive region of the circuit substrate through the recess at the edge of the semiconductor die, wherein solder is present in the recess.

12. The semiconductor die package of claim 11 wherein the vertical transistor comprises a vertical MOSFET.

13. The semiconductor die package of claim 11 wherein the back side is metallized.

14. The semiconductor die package of claim 11 further comprising a heat sink, wherein the heat sink is attached to the back side of the semiconductor die.

15. The semiconductor die package of claim 11 wherein the recess is in the form of a half-cone.

16. The semiconductor die package of claim 11 wherein the edge is a first edge of the semiconductor die, and wherein the semiconductor die includes a second recess at a second edge of the semiconductor die.

17. A semiconductor die package comprising:

(a) a circuit substrate including a first conductive region and a second conductive region;

(b) a semiconductor die comprising a vertical transistor on the circuit substrate, wherein the semiconductor die includes an edge and a recess at the edge, wherein the recess extends through the semiconductor die, and wherein the semiconductor die includes a front side, a backside, a source region at the front side, and a drain region at the back side;

(c) a first solder joint coupling the drain region of the semiconductor die and the first conductive region of the circuit substrate through the recess at the edge of the semiconductor die, wherein solder present in the recess; and (d) a second solder joint coupling the source region to the second conductive region of the circuit substrate.

18. The semiconductor die package of claim 17 further comprising a heat sink attached to the back side of the semiconductor die.

* * * * *

UNITED STATES PATENT AND TRADEMARK OFFICE
CERTIFICATE OF CORRECTION

PATENT NO. : 6,830,959 B2
DATED : December 14, 2004
INVENTOR(S) : Maria Cristina B. Estacio It is certified that error appears in the above-identified patent and that said Letters Patent is hereby corrected as shown below:

Column 3,
Line 36, kindly delete "High RDSon", and insert -- Low RDSon --

Column 9,
Line 4, kindly delete "deposition", and insert -- depositing --

Signed and Sealed this

Tenth Day of May, 2005

JON W. DUDAS
*Director of the United States Patent and Trademark Office*